(12) United States Patent
Saafir et al.

(10) Patent No.: US 7,649,312 B2
(45) Date of Patent: Jan. 19, 2010

(54) DISPLAY DEVICE WITH IMPROVED HOLE INJECTION EFFICIENCY AND METHOD OF MAKING THE SAME

(75) Inventors: Ameen Khalil Saafir, Gyeonggi-do (KR); Jin-koo Chung, Gyeonggi-do (KR); Nam-deog Kim, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 460 days.

(21) Appl. No.: 11/408,378

(22) Filed: Apr. 21, 2006

(65) Prior Publication Data

US 2006/0267489 A1    Nov. 30, 2006

(30) Foreign Application Priority Data

May 31, 2005    (KR)    .............. 10-2005-0046205

(51) Int. Cl.
    *H05B 33/00*    (2006.01)
(52) U.S. Cl. ................ 313/506; 313/504; 428/917
(58) Field of Classification Search ................ None
    See application file for complete search history.

(56) References Cited

U.S. PATENT DOCUMENTS

| | | | |
|---|---|---|---|
| 7,157,157 B2* | 1/2007 | Yamamoto et al. | 428/690 |
| 7,271,535 B2* | 9/2007 | Kobayashi | 313/504 |
| 7,400,087 B2* | 7/2008 | Yamazaki | 313/504 |
| 7,402,944 B2* | 7/2008 | Jeong et al. | 313/503 |
| 7,417,373 B2* | 8/2008 | Yamazaki | 313/506 |
| 7,423,373 B2* | 9/2008 | Sakakura et al. | 313/509 |

FOREIGN PATENT DOCUMENTS

| JP | 2002-334782 | 11/2002 |
|---|---|---|
| JP | 2004-319119 | 11/2004 |
| KR | 2002-0041301 | 3/2004 |

* cited by examiner

*Primary Examiner*—Ashok Patel
(74) *Attorney, Agent, or Firm*—Innovation Counsel LLP

(57) ABSTRACT

An organic light emitting diode (OLED) display device with improved hole injection efficiency is presented, along with a method of making the display device. A thin film transistor (TFT) is formed on an insulating substrate. A pixel electrode is electrically connected to the TFT, and a hydrophilic wall is formed between the pixel electrode and an adjacent pixel electrode. A hole injecting layer and a first organic light emitting layer covering the pixel electrode and the hydrophilic wall and formed. Then, a second organic light emitting layer and a third organic light emitting layer are formed to partly cover the first organic light emitting layer.

13 Claims, 7 Drawing Sheets

DISPLAY DEVICE WITH IMPROVED HOLE INJECTION EFFICIENCY AND METHOD OF MAKING THE SAME

CROSS-REFERENCE TO RELATED APPLICATIONS

This application claims priority from Korean Patent Application No. 2005-0046205 filed on May 31, 2005, in the Korean Intellectual Property Office, the disclosure of which is incorporated herein by reference.

BACKGROUND OF THE INVENTION

1. Field of the Invention

The present invention relates to a display device and a method of making the display device.

2. Description of the Related Art

OLED (organic light emitting diode) is a type of flat panel display that has recently become popular. Some reasons for the increase in its popularity include advantages such as low-voltage driving, light weight, slim shape, wide angular field and quick response. OLED is classified into passive matrix and active matrix types depending on the driving method that is used. The passive matrix OLED is simple to manufacture but its power consumption rapidly increases with the display size and resolution. Therefore, the passive matrix OLED is mainly employed in small-display applications.

Unlike the passive matrix OLED, the active matrix OLED is complicated to manufacture. However, it is useful in big screen and high resolution applications.

In the active matrix OLED, a TFT is connected to each of a plurality of pixel areas. Each pixel area separately controls an organic light emitting layer that emits light. A pixel electrode is disposed in each pixel area and each pixel electrode is electrically separated from the adjacent pixel electrode so that each pixel electrode is driven separately. Further, a nonconductive wall is formed between adjacent pixel areas to prevent the pixel electrodes from short-circuiting and to separate the pixel areas. Between the walls, a hole injecting layer and the organic light emitting layer are sequentially formed on the pixel electrode.

The hole injecting layer, which is usually in an aqueous suspension state, is formed by ink-jetting on the pixel area and subjected to a drying process. However, since the wall is usually made of a polymer such as polyamide, which is hydrophobic, a de-wetting phenomenon occurs around the wall causing the hole injecting layer around the wall becomes thin. Accordingly, hole injecting efficiency decreases in the region around the wall, decreasing the brightness of the OLED device.

SUMMARY OF THE INVENTION

The present invention provides a display device with improved hole injecting efficiency.

In one aspect, the invention is a display device including a thin film transistor (TFT) formed on an insulating substrate, a first electrode electrically connected with the TFT, a hydrophilic wall between the first electrode and an adjacent electrode that is adjacent to the first electrode, a hole injecting layer and a first organic light emitting layer covering the first electrode and the hydrophilic wall, a second organic light emitting layer and a third organic light emitting layer partly covering the first organic light emitting layer, and a second electrode formed on the organic light emitting layer.

The hydrophilic wall may include silicon oxide.

The combined thickness of the first electrode, the first organic light emitting layer and the hole injecting layer is greater than a thickness of the hydrophilic wall.

The thickness of the hydrophilic wall may be 1000 Å~1500 Å.

The hole injecting layer and the first organic light emitting layer may be continuously formed.

The first organic light emitting layer may be capable of emitting blue light. The second organic light emitting layer may be capable of emitting red light and the third organic light emitting layer may be capable of emitting green light.

The second organic light emitting layer and the third organic light emitting layer may be disposed on the first electrode.

The hole injecting layer may include one or both of PEDOT (poly 3,4-ethylenedioxythiopene) and PSS (polystyrenesulphonic acid).

The organic light emitting layers may include polymers.

A channel layer of the TFT may include amorphous silicon.

The cross section of the hydrophilic wall becomes narrower as the hydrophilic wall extends away from the insulating substrate.

In another aspect, the invention is a method of making a display device. The method entails forming a TFT on an insulating substrate, forming a first electrode electrically connected to the TFT, forming a hydrophilic wall between the first electrode and an adjacent electrode that is adjacent to the first electrode, forming a hole injecting layer and a first organic light emitting layer in order covering the first electrode and the hydrophilic wall, forming a second organic light emitting layer and a third organic light emitting layer partly covering the first organic light emitting layer, and forming a third organic light emitting layer partly covering the first organic light emitting layer.

The forming of the hydrophilic wall may entail depositing a silicon oxide layer by chemical vaporization deposition and patterning the silicon oxide layer.

The hole injecting layer and the first organic light emitting layer may be continuously deposited by slit coating.

Forming the hole injection layer and the first organic light emitting layer may entail making a combined thickness of the hole injection layer and the first organic light emitting layer greater than the thickness of the hydrophilic wall.

The forming of the hole injecting layer includes depositing a hole injecting substance mixed with water.

The hole injecting substance may include one or both of PEDOT (poly 3,4-ethylenedioxythiopene) and PSS (polystyrenesulphonic acid).

The forming the second organic light emitting layer and the third organic light emitting layer may be performed by ink-jet method.

BRIEF DESCRIPTION OF THE DRAWINGS

The above and/or other aspects and advantages of the present invention will become apparent and more readily appreciated from the following description of the exemplary embodiments, taken in conjunction with the accompanying drawings of which.

DETAILED DESCRIPTION OF THE EMBODIMENT

Figure 1:
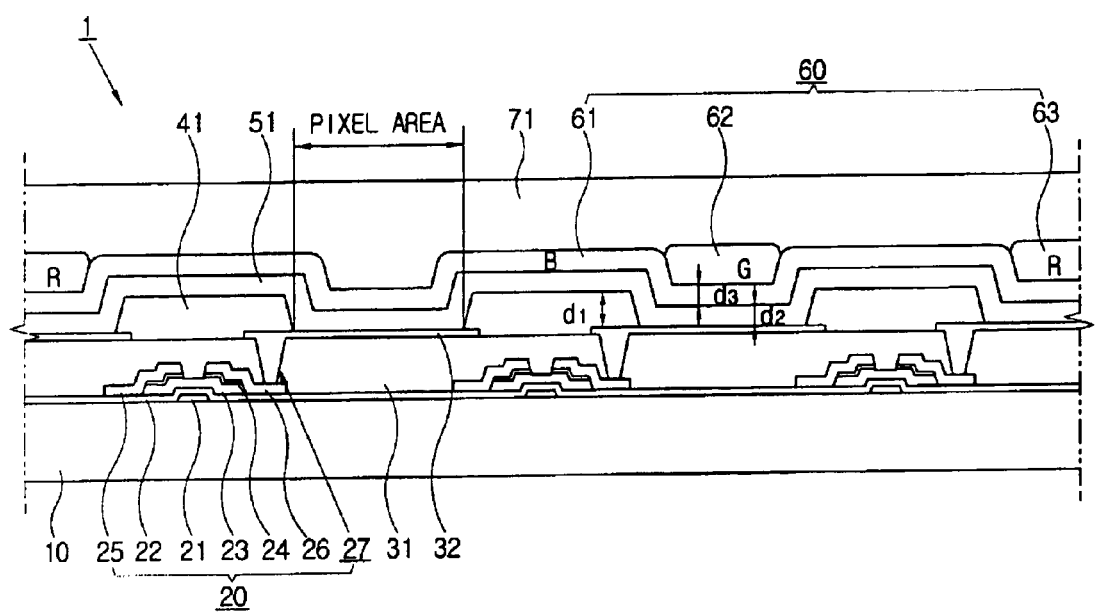
FIG. 1 is a sectional view of a display device according to a first embodiment of the present invention.

Reference will now be made in detail to exemplary embodiments of the present invention, examples of which are illustrated in the accompanying drawings, wherein like reference numerals refer to like elements throughout. The embodiments are described below in order to explain the present invention by referring to the figures.

A display device 1 includes a TFT 20 formed on an insulating substrate 10, a pixel electrode 32 electrically connected to the TFT 20, a hydrophilic wall 41 between the pixel electrodes 32, a hole injecting layer 51 and an organic light emitting layer 60 formed on the hydrophilic wall 41, and a common electrode 71 formed on the organic light emitting layer 60.

The first embodiment will be described with the TFT 20 using amorphous silicon, for example, but possibly using polysilicon.

Description of the TFT 20 according to the first embodiment is following in detail.

A gate electrode 21 is formed on the insulating substrate 10, which includes an insulating substance such as glass, quartz, ceramic or plastic.

A gate insulating layer 22 made of silicon nitride (SiNx) and the like is formed on the insulating substrate 10 and the gate electrode 21. On the part of the gate insulating layer 22 that is above and around the gate electrode 21 is disposed on a semiconductor layer 23 and an ohmic contact layer 24. The semiconductor layer 23 may be made of amorphous silicon, and the ohmic contact layer 24 may be made of n+ hydrogenated amorphous silicon highly-doped with n-type dopant. Here, the ohmic contact layer 24 is divided into two parts with respect to the gate electrode 21.

A source electrode 25 and a drain electrode 26 are formed on the ohmic contact layer 24 and the gate insulating layer 22. The source electrode 25 and the drain electrode 26 are disposed across the gate electrode 21 from each other.

A protection layer 31 is formed on the source electrode 25, the drain electrode 26, and the portion of the semiconductor layer 23 that is not covered by the source or drain electrode. The protection layer 31 may be made of silicon nitride (SiNx) or/and an organic layer. A contact hole 27 exposing the drain electrode 26 is formed on the protection layer 31.

A pixel electrode 32 is formed on the protection layer 31. The pixel electrode 32 is also called an anode and provides positively-charged holes to the organic light emitting layer 60. The pixel electrode 32 is made of transparent conductive substance such ITO (indium tin oxide) or IZO (indium zinc oxide) or the like.

A hydrophilic wall 41 is formed between the pixel electrodes 32. The hydrophilic wall 41 divides neighboring the pixel electrodes 32 to define a pixel area and is formed on the contact hole 27. Further, the hydrophilic wall 41 prevents the source electrode 25 and the drain electrode 26 from short-circuiting with the common electrode 71.

The hydrophilic wall 41 may be made of a hydrophilic substance, such as silicon nitride, silicon oxide, or the like and is not made of a hydrophobic polymer substance. The hydrophilic wall 41 is formed such that a plateau forms in the region above each TFT, and the width of each plateau decreases gradually with height. Thus, the sidewalls of the hydrophilic wall 41 are slanted.

A hole injecting layer 51 is formed on the hydrophilic wall 41 and the portions of the pixel electrode 32 that is not covered with the hydrophilic wall 41. The hole injecting layer 51 is continuously coated to cover the pixel electrode 32 and a surface of the hydrophilic wall 41. The hole injecting layer 51 covers the wall 41 and the pixel electrode 32. Furthermore, the hole injecting layer 51 has a substantially constant thickness in the areas above the pixel electrode 32 and the areas adjacent to the wall 41. Since the hole injecting layer 51 is formed in uniform thickness on the overall pixel area, hole injecting efficiency is excellent.

The hole injecting layer 51 contains a hole injecting substance such as PEDOT (poly 3,4-ethylenedioxythiopene) and PSS (polystyrenesulphonic acid). The hole injecting layer 51 is formed by mixing the hole injecting substance and water and the ink-jetting the mixture in an aqueous suspension state.

A first organic light emitting layer 61 is formed on the hole injecting layer 51. The first organic light emitting layer 61 is formed over substantially the same area as the hole injecting layer 51. Accordingly, the pixel electrode 32 and the wall 41 are covered by the hole injecting layer 51 and the first organic light emitting layer 61, which are formed in that order. The thickness of the first organic light emitting layer 61 is substantially constant, as is the thickness of the hole injecting layer 51.

A hole transmitted from the pixel electrode 32 and an electron transmitted from the common electrode 71 combine in the organic light emitting layer 60 to form an exciton. Light is generated as the exciton comes down in its energy level. The organic light emitting layer 60 is made of a polymer substance and the first organic light emitting layer 61 is made of a substance capable of emitting blue light.

Here, the first organic light emitting layer 61 is thicker than the hydrophilic wall 41. Referring to FIG. 1, the thickness d1 of the hydrophilic wall 41 is less than the sum of the thickness d2 of the hole injecting layer 51 and the thickness d3 of the first organic light emitting layer 61. The thickness d1 of the hydrophilic wall 41 may be 1000 Å~1500 Å. Since the hydrophilic wall 41 is thinner than the first organic light emitting layer 61 and becomes narrower as it gets farther from the insulating substrate 10, the hole injecting layer 51 and the first organic light emitting layer 61 are easily formed continuously and the lateral side of the hydrophilic wall 41 may have a gentle profile.

On the first organic light emitting layer 61 are formed a second organic light emitting layer 62 capable of emitting green light and a third organic light emitting layer 63 capable of emitting red light. The second organic light emitting layer 62 and the third organic light emitting layer 63 are provided in a regular pattern and are disposed in the areas above the pixel electrode 32. The second organic light emitting layer 62 and the third organic light emitting layer 63 are directly provided with electrons from the common electrode 71, while the hole is provided through the first organic light emitting layer 61.

In the parts of the organic light emitting layer 60 that include both the blue light emitting layer and the green light emitting layer, it is known that the green light having a lower energy is emitted and the blue light emitting layer transfers energy to the green light emitting layer. In the portions of the organic light emitting layer 60 having the blue light emitting layer and the red light emitting layer, the red light having a lower energy is emitted.

Accordingly, green light is emitted even if the first organic light emitting layer 61 emitting the blue light is formed in the pixel area where the second organic light emitting layer 62 is formed. Similarly, red light is emitted in the pixel area where the third organic light emitting layer 63 is formed, even if the first organic light emitting layer 61 is in the same pixel area.

The common electrode 71 is formed on the organic light emitting layer 60. The common electrode 71 is called a cathode and provides electrons to the organic light emitting layer 60. The common electrode 71 is made of an opaque substance like aluminum, and light emitted in the organic light emitting layer 60 exits in the direction of the insulating substrate 10. This configuration is generally called a bottom-emission configuration.

Although not shown in the drawings, the display device 1 may further include an electron transfer layer and an electron injection layer between the organic light emitting layer 60 and the common electrode 71. Furthermore, it may include a protection layer to protect the common electrode 71 and a bag to prevent moisture and air from infiltrating the organic light emitting layer 60.

The hole injecting layer 51 is continuously formed with a substantially constant thickness in the display device 1 according to the first embodiment. Accordingly, holes are efficiently provided to the overall pixel area and brightness is improved.

Hereinafter, a method of making the display device according to the first embodiment will be described with reference to FIGS. 2a through 2e.

Figure 2A:
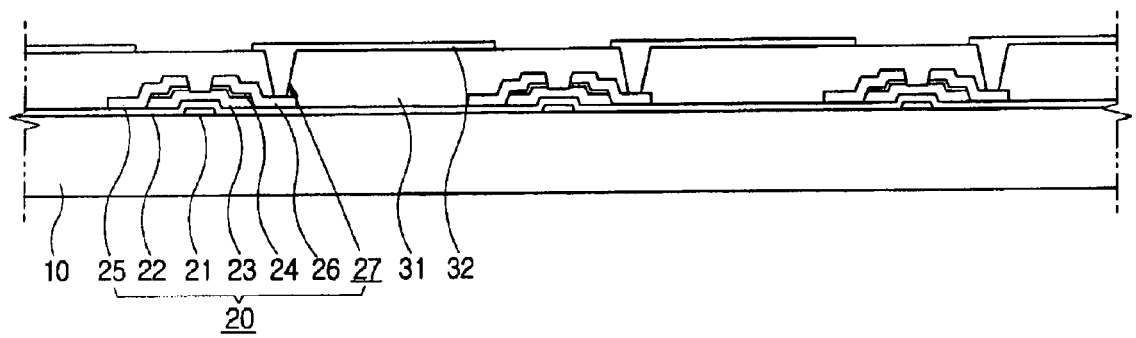
FIGS. 2a through 2e are sectional views showing a method of making the display device of FIG. 1.

First, a TFT 20 is formed on the insulating substrate 10, as shown in FIG. 2a. A channel in the TFT 20 is made of amorphous silicon and is manufactured by any of the suitable well-known methods. A protection layer 31 is formed on the TFT 20. When the protection layer 31 is made of silicon nitride, CVD (chemical vapor deposition) technique may be used to form the protection layer 31. The protection layer 31 is patterned by photolithography, thereby forming the contact hole 27 that exposes part of the drain electrode 26. Then, the pixel electrode 32 is formed such that it is connected to the drain electrode 26 through the contact hole 27. The pixel electrode 32 is formed by depositing a layer of ITO by sputtering and patterning the ITO layer.

Figure 2B:
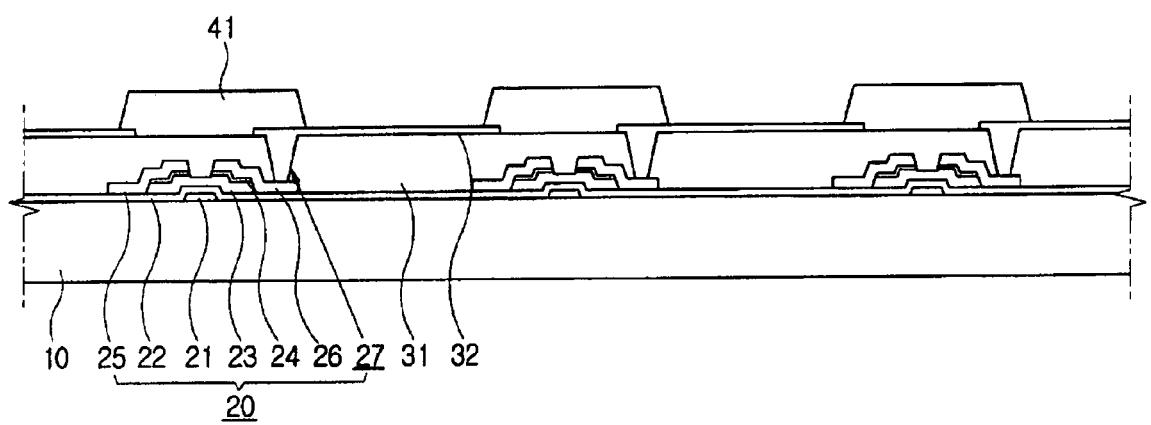

Then, the hydrophilic wall 41 is formed between the adjacent pixel electrodes 32 in FIG. 2b. When the hydrophilic wall 41 is made of silicon nitride, the hydrophilic wall 41 is formed by depositing a silicon nitride layer by CVD and patterning the layer using photolithography. The hydrophilic wall 41 becomes narrower as it gets farther from the insulating substrate 10, and the hydrophilic wall 41 is disposed on the TFT 20 and the contact hole 27.

Figure 2C:
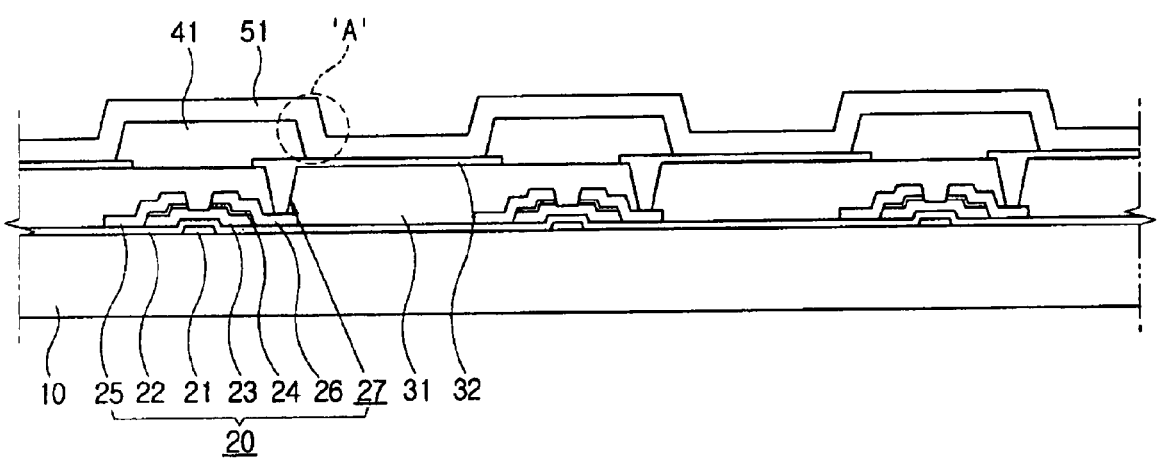

Thereafter, the hole injecting layer 51 is formed on the hydrophilic wall 41 and the portions of the pixel electrode 32 that is not covered by the hydrophilic wall 41, as shown in FIG. 2c. The hole injecting layer 51 is formed by mixing the hole injecting substance and water and using nozzle coating or spin coating. Slit-coating may also be used. Since wettability of the hole injecting layer 51 increases due to the hydrophilicity of the hydrophilic wall 41, the hole injecting layer 51 is formed in uniform thickness on the overall wall 41. Furthermore, since the hydrophilic wall 41 is relatively thin and becomes narrower as it extends away from the insulating substrate 10, the lateral side (designated as "A" in FIG. 2c) of the hydrophilic wall 41 also is made to have an excellent sloped profile. After the nozzle coating or the spin coating, a dry process may be performed in order to remove the water.

Figure 2D:
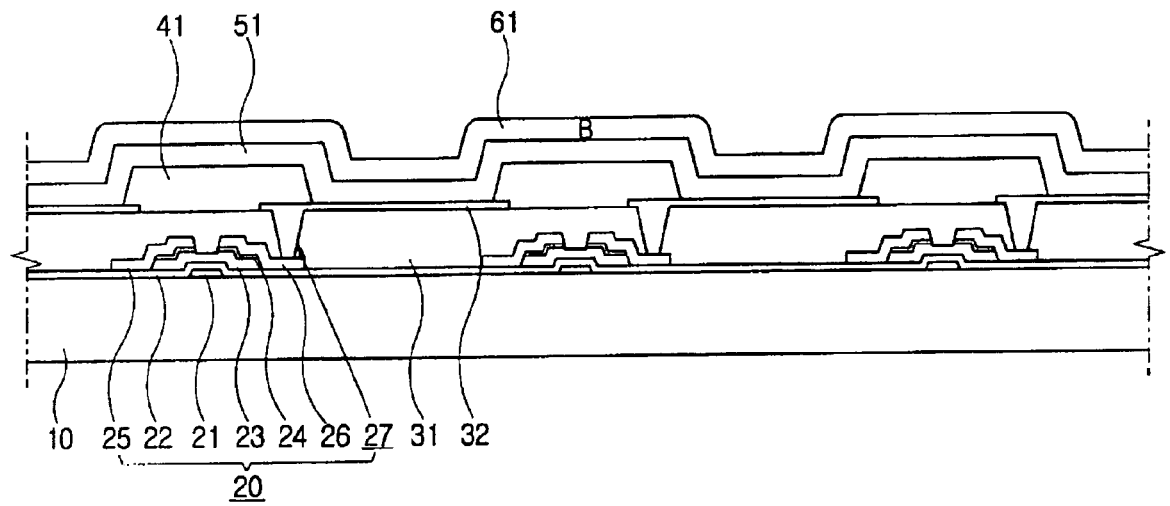

Then, the first organic light emitting layer 61 is formed on the hole injecting layer 51 as shown in FIG. 2d. The first organic light emitting layer 61 is formed by dissolving a light emitting polymer in an organic solvent and using the nozzle coating or the spin coating method. The first organic light emitting layer 61 is formed in the same area as the hole injecting layer 51 and is disposed above the hydrophilic wall 41. After the nozzle coating or the spin coating process, a drying process may be performed in order to remove the organic solvent. Oscillation, heat treatment, and flow of nitrogen gas may be used in the drying process.

Since the hole injecting layer 51 and the first organic light emitting layer 61 may be made by using the nozzle coating or spin coating method instead of the more complicated inkjet method, the manufacturing process is simplified.

Figure 2E:
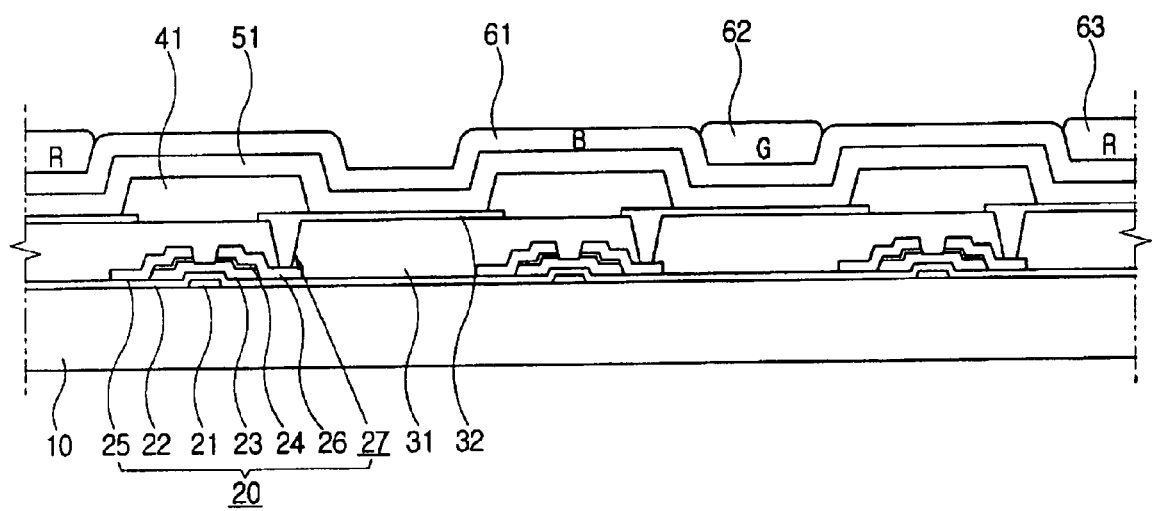

Thereafter, the second organic light emitting layer 62 and the third organic light emitting layer 63 are formed on the first organic light emitting layer 61, as shown in FIG. 2e. The second organic light emitting layer 62 and the third organic light emitting layer 63 are formed by the inkjet method. Here, there is a "dip" in the area where the second organic light emitting layer 62 and the third organic light emitting layer 63 are to be formed, the dip corresponding to a region between neighboring hydrophilic walls 41. The dips facilitate the application of the inkjet method.

Then, when the common electrode 71 is formed on the organic light emitting layer 60, the display device shown in FIG. 1 is completed.

Figure 3:
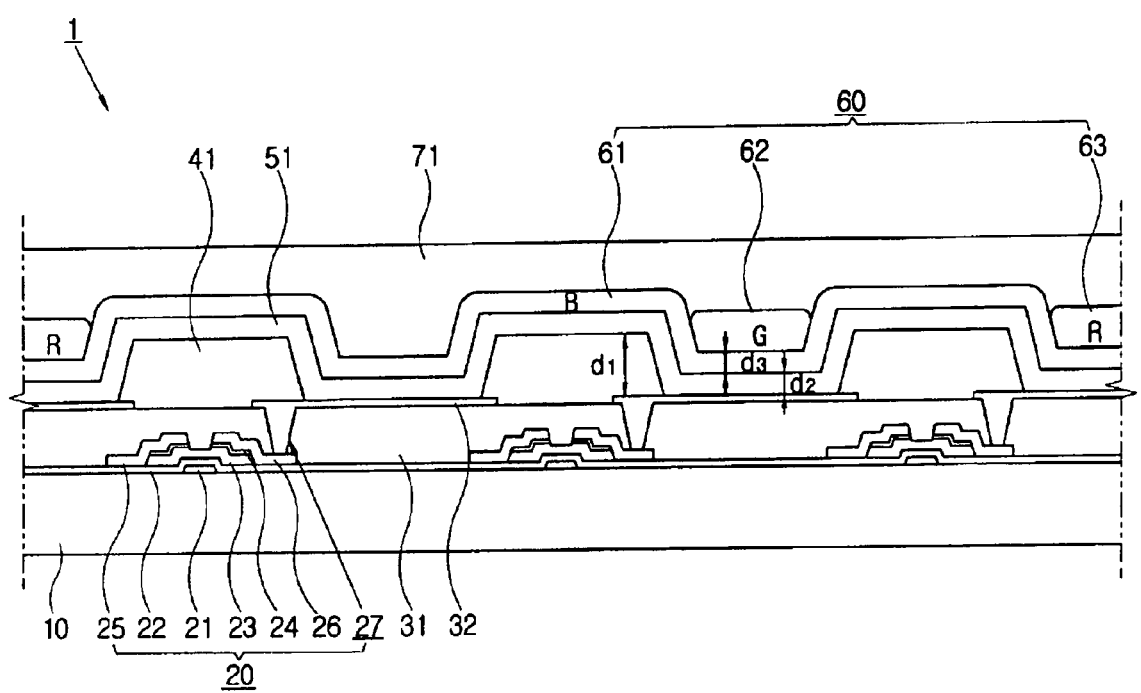
FIG. 3 is a sectional view of a display device according to a second embodiment of the present invention.

Hereinbelow, a display device according to a second embodiment of the present invention will be described with reference to FIG. 3 focusing on the difference(s) from the display device of the first embodiment.

In the display device 1 according to the second embodiment, the first organic light emitting layer 61 disposed in a pixel area is disposed thinner than the hydrophilic wall 41. In other words, the thickness d1 of the hydrophilic wall 41 is greater than the sum of the thickness d2 of a hole injecting layer 51 and the thickness d3 of the first organic light emitting layer 61. In the second embodiment, there is enough distance between the TFT 20 and the common electrode 71 to eliminate concerns of short-circuiting. Due to enough distance between the TFT 20 and the common electrode 71, it is possible to reduce undesirable capacity.

Although a few embodiments of the present invention have been shown and described, it will be appreciated by those skilled in the art that changes may be made to these embodiments without departing from the principles and spirit of the invention, the scope of which is defined in the appended claims and their equivalents.

What is claimed is:

1. A display device comprising:
   a thin film transistor formed on an insulating substrate;
   a first electrode electrically connected to the thin film transistor;
   a hydrophilic wall between the first electrode and an adjacent electrode adjacent to the first electrode;
   a hole injecting layer continuously formed and covering the first electrode and the hydrophilic wall;
   an organic light emitting layer disposed on the hole injecting layer; and
   a second electrode formed on the organic light emitting layer.

2. The display device according to claim 1, wherein the hydrophilic wall comprises silicon oxide.

3. The display device according to claim 1, wherein the thickness of the hydrophilic wall is 1000 Å~1500 Å.

4. The display device according to claim 1, wherein the hole injecting layer comprises one or both of PEDOT (poly 3,4-ethylenedioxythiopene) and PSS (polystyrenesulphonic acid).

5. The display device according to claim 1, wherein the organic light emitting layer comprises polymers.

6. The display device according to claim 1, wherein a channel layer of the thin film transistor comprises amorphous silicon.

7. The display device according to claim 1, wherein the hydrophilic wall becomes narrower as the hydrophilic wall extends away from the insulating substrate.

8. The display device according to claim 1, wherein the organic light emitting layer comprises:
- a first organic light emitting layer covering the hole injecting layer; and
- a second organic light emitting layer and a third organic light emitting layer partly covering the first organic light emitting layer.

9. The display device according to claim 8, wherein a combined thickness of the first electrode, the first organic light emitting layer and the hole injecting layer is greater than a thickness of the hydrophilic wall.

10. The display device according to claim 8, wherein the first organic light emitting layer is continuously formed.

11. The display device according to claim 8, wherein the first organic light emitting layer is capable of emitting blue light.

12. The display device according to claim 8, wherein the second organic light emitting layer is capable of emitting red light and the third organic light emitting layer is capable of emitting green light.

13. The display device according to claim 8, wherein the second organic light emitting layer and the third organic light emitting layer are disposed on the first electrode.

* * * * *